United States Patent [19]

Safari et al.

[11] Patent Number: 5,796,207

[45] Date of Patent: Aug. 18, 1998

[54] ORIENTED PIEZO ELECTRIC CERAMICS AND CERAMIC/POLYMER COMPOSITES

[75] Inventors: Ahmad Safari, Princeton Junction; Stephen C. Danforth, Belle Mead; Amit Bandyopadhyay, Edison; Victor F. Janas, Monroe Township; Rajesh Kumar Panda, New Brunswick, all of N.J.

[73] Assignee: Rutgers, The State University of New Jersey, New Brunswick, N.J.

[21] Appl. No.: 847,901

[22] Filed: Apr. 28, 1997

[51] Int. Cl.$^6$ ................................................. H01L 41/08
[52] U.S. Cl. .......................... 310/358; 310/334; 310/357
[58] Field of Search ................................ 310/334, 337, 310/357, 358

[56] References Cited

U.S. PATENT DOCUMENTS

| | | | |
|---|---|---|---|
| 3,659,123 | 4/1972 | Oya | 310/358 |
| 3,883,825 | 5/1975 | Haan | 310/337 |
| 4,422,003 | 12/1983 | Safari et al. | 310/358 |
| 5,164,920 | 11/1992 | Bast et al. | 367/140 |
| 5,435,060 | 7/1995 | Hayes | 29/890.1 |

FOREIGN PATENT DOCUMENTS

| | | | |
|---|---|---|---|
| 57-202112 | 12/1982 | Japan | 310/357 |
| 63-53985 | 3/1988 | Japan | 310/358 |

OTHER PUBLICATIONS

Kahn et al., "Calculations and Measurements of the Spatial Piezoelectric Response and of the $d_{15}$ Parameter of PZT5A Ceramic"; J. Am. Ceram. Soc., 72 [5], 1989, pp. 785–790, no month.

Batha; "Effect of piezoelectric rod orientation on optimum sensitivity"; SPIE Smart Structures and Materials Proceedings, pp. 294–299, 1993, No month.

A. Bandyopadhyay et al.; Processing of Piezocomposites by Fused Deposition Technique; Proceedings of Intl. Symposium in the Applications of Ferrdietrics, Aug. 1996, pp. 999–1002.

Primary Examiner—Thomas M. Dougherty
Attorney, Agent, or Firm—John F. Ritter

[57] ABSTRACT

This invention relates to novel oriented piezoelectric ceramic and ceramic/polymer composites. More particularly, it provides a novel piezoelectric composite design wherein the ceramic piezoelectric phase is oriented at an angle with respect to the direction of applied stress, thus giving improved electromechanical properties.

21 Claims, 3 Drawing Sheets

ORIENTED PIEZO ELECTRIC CERAMICS AND CERAMIC/POLYMER COMPOSITES

TECHNICAL FIELD

This invention relates to novel oriented piezoelectric ceramic and ceramic/polymer composites. More particularly, it provides a series of novel composite structures, having numerous designs and connectivity. In such composites, the active ceramic piezoelectric phase is oriented at an angle with respect to the direction of the application of stress and applied voltage, thus exhibiting improved properties.

BACKGROUND OF THE INVENTION

1. Piezoelectricity

Piezoelectric materials respond to the application of a stress by producing a polarization on the faces of its structure. The following equation shows the polarization and charge coefficients when stress is applied to a block of poled piezoelectric Lead Zirconate Titanate (PZT) material:

$$\begin{vmatrix} P_1 \\ P_2 \\ P_3 \end{vmatrix} = \begin{vmatrix} 0 & 0 & 0 & 0 & d_{15} & 0 \\ 0 & 0 & 0 & d_{15} & 0 & 0 \\ d_{31} & d_{31} & d_{33} & 0 & 0 & 0 \end{vmatrix} \begin{vmatrix} \sigma_1 \\ \sigma_2 \\ \sigma_3 \\ \sigma_4 \\ \sigma_5 \\ \sigma_6 \end{vmatrix} \quad (1)$$

For PZT 5H, typical piezoelectric coiefficients are $d_{33}$=600 pC/N $d_{31}$=−270 pC/N $d_{15}$=800 pC/N Here the charge coefficients are denoted by $d_{ab}$, which is a measure of the charge accumulation due to the application of a unit stress. The subscript 'a' denotes the direction perpendicular to the electroded surface in which the charge is applied while 'b' denotes the direction of applied stress. For example, the coefficient $d_{31}$ denotes a charge collected in the direction 3 (i.e., on the Z face) when a stress is applied along the direction 1 (i.e., on the X face).

With the exception of $d_{33}$, $d_{31}$ and $d_{15}$, all other coefficients are zero due to the symmetry in the crystal structure of PZT. For a poled block of material, the $d_{33}$ coefficient is obtained when a stress $\sigma_3$ is applied along the Z 3 direction. The charge is also collected on the face perpendicular to the Z direction. To measure the $d_{31}$ coefficient, a stress or stress component $\sigma_1$ or $\sigma_2$, is applied along either the X(1) or Y(2) direction and the polarization is collected on the face perpendicular to the z direction. This coefficient is, however, negative in sign relative to the $d_{33}$ coefficient.

Similarly, to measure the $d_{15}$ component, shear stresses σ23 ($\sigma_4$) or $\sigma_{13}$ ($\sigma_5$) must be applied and the polarization is thereafter measured on the face perpendicular to the X direction. The above example discusses polarization measurements due to stresses applied on a PZT material.

Other piezoelectric materials including Pb(xZr,(1−x)Ti)$O_3$, $BaTiO_3$, $PbZrO_3$, $PbTiO_3$, $PbNb_2O_6$, $(Pb,Ca)TiO_3$, $(Pb,Sm)TiO_3$, $Pb(NbO_2)_2/PbTiO_3$, $(1-x)Pb(Mg_{1/3}Nb_{2/3})O_3-xPbTiO_3$, $(1-x-y)Pb(Zn_{1/3}Nb_{2/3})O_3-xPbTiO_3-yBaTiO_3$, and $(1-x-y)Pb(Zn_{1/3}Nb_{2/3})O_3-xBaTiO_3-yPbTiO_3$, xPZN-(1−x)PMN, xPMN-(1−x)PZT, PNN-PZ-PT and xPZN-(1-x)PZT will behave similarly upon the application of shear and normal stresses. The polarization will depend on the d coefficient matrix which is a property of the crystal structure of the material.

Instead of looking for an entirely new class of piezoelectric materials without the inherent limitations of these materials, researchers in the last two decades have successfully made composites of piezoelectric ceramics with inactive polymers. These piezocomposites show excellent electromechanical properties while limiting the various detrimental properties of the ceramic monoliths. The properties of the ceramic/polymer composites can be tailored by changing the connectivity of the phases, volume fraction of the ceramic in the composite, and the spatial distribution of the active ceramic phase.

These composites have many advantages over traditional monolithic piezoelectric ceramics including : (i) lower densities resulting in acoustic impedance closer to those of the human body, water, etc., thereby eliminating the need for an acoustic matching layer; (ii) low dielectric constants resulting in a high piezoelectric voltage constant g; and (iii) ease of conformability to the shape of the backing material of the composite. Such composite piezoelectric transducers and methods for their production, are described, for example, in Composite Piezoelectric Transducer; R. E. Newnham et al.; Materials in Engineering, Vol. 2, December 1980, Pages 93–106, which is incorporated herein by reference.

The concept of connectivity describes the arrangement of the component phases within a composite. Some of the most common connectivities include, 1-3, 2-2, and 3-3, where the first digit refers to the self-connectivity of the active ceramic phase while the second digit refers to the same of the inactive polymer phase. The 1-3 composite consists of rods, bars, or fibers of ceramic phase which are continuous only in the longitudinal or 1 direction, while the polymer phase is continuous in all three directions.

Composites with 1-3 connectivity have been widely studied because a high degree of acoustic isolation between the neighboring elements can be achieved. 1-3 composites have a high thickness mode coupling coefficient ($k_t$), and a low value of the planar coupling coefficient ($k_p$). This allows for a very efficient conversion of energy in the thickness vibration mode and also minimizes the unwanted lateral modes. These types of composites also show a very high $d_{33}$. When used in an hydrostatic mode they partially reduce the negative $d_{31}$ component because of the acoustic isolation of the rods from each other.

In the case of the 2-2 composite, both the ceramic and polymer phases are two-dimensionally self-connected throughout the composite. The stiff ceramic phase supports most of the stress applied in the direction of its alignment, yielding a high piezoelectric charge coefficient d, while the composite has a low density and dielectric constant.

In the 3-3 composite, both the ceramic and the polymer phases are continuously self-connected in all three dimensions.

The geometry and structure yields a high piezoelectric charge coefficient d and exhibits superior properties over single phase piezoelectric materials.

To enhance the performance of the piezoelectric devices, significant research was carried out to fully utilize the $d_{33}$ coefficient. This was, in part, due to the fact that it is relatively simple to apply normal stress along the Z direction and collect the charge on the face perpendicular to the Z direction. Likewise, efforts have also been made to reduce the effect of the $d_{31}$ coefficient (as this coefficient is of the opposite sign to the $d_{33}$ coefficient).

This becomes more important in, for example, hydrophone applications where a hydrostatic stress acts on the transducer. A high figure of merit (FOM) is desired from a piezoelectric transducer when it is used for hydrophone applications. The following equation shows the dependence of the FOM on the various constants.

$$\text{Figure of Merit} = d_h * g_h \quad (2)$$

$$d_h = d_{33} + 2d_{31} \quad (3)$$

$$g_h = d_h / \epsilon_o K \quad (4)$$

Here K is the dielectric constant of the composite and $\epsilon_o$ is a constant equal to the permittivity of free space. Therefore, in order to increase the value for the FOM, one can increase the $d_{33}$ coefficient, decrease the $d_{31}$ (which is negative), or both.

1-3 composites have a high $d_{33}$ value and a low $d_h$ value because of the negative contribution of the $d_{31}$ coefficient. Therefore, to reduce the impact of the negative $d_{31}$ coefficient, glass fibers oriented in the x and y directions have been used to decrease the effective stress components along those directions. 3-3 composites have been shown to be particularly well suited for hydrophones as they reduce the detrimental effect of the $d_{31}$ coefficient.

A new generation of flextensional actuators, Moonies and Cymbals, have been designed by Newnham et al. and that is described in detail in U.S. Pat. No. 5,276,654. In these actuators, the negative $d_{31}$ component is used to an advantage to enhance the overall actuation due to an applied charge. The brass electrodes in these composites were designed such that the application of a compressive stress $\sigma_3$ on the composite induced tensile stress in the x and y directions. These tensile stresses therefore make the $d_{31}$ component additive to $d_{33}$ component. Hence, the effective $d_{33}$ measured for these actuators is a combination of both the $d_{33}$ and the $d_{31}$ components.

However, researchers have not been successful in effectively utilizing the high value of the $d_{15}$ component to enhance the performance of piezoelectric devices. This, despite the fact that, as evidenced in Equation 1 above, it typically has a much higher value than the traditionally utilized $d_{33}$ coefficient and thus there is much to be gained through its utilization.

The $d_{15}$ component can be utilized only by applying a shear stress $\sigma_4$ or $\sigma_5$ as shown in FIG. 1, and collecting the charge on the face perpendicular to the X or Y direction. The main reason for the historical underutilization of this coefficient is the difficulty in applying the shear stress and collecting the charge. Moreover, the faces on which the charge is collected due to the $d_{15}$ coefficient are different than those for the $d_{33}$ component.

Thus, it is difficult to collect charges due to both coefficients at the same time. Additionally, the processing limitations of conventional ceramic fabrication techniques do not allow the fabrication for the verification and the optimization of the novel composite designs that allow for the utilization of this $d_{15}$ coefficient.

2. Piezoelectric Processing Methods

A. Conventional

A common and convenient method for making 2-2 and 1-3 composites is to start by cutting parallel slots into a monolithic piezoelectric ceramic block. The slots are then filled with a polymer. The aforementioned method is known as the "dice and fill" method and is described in PZT-Epoxy Piezoelectric Transducers: A Simplified Fabrication Procedures, H. P. Savakus et al.; Materials Research Bulletin, Vol. 16, 1981, pages 677–680, which is incorporated herein by reference.

Two common methods for making piezoelectric composites with 3-3 connectivities are the replamine and burned-out plastic spheres, or BURPS, processes. The replamine process is a lost wax method with coral as a starting material. The coral is machined to the desired geometry and then back-filled with wax. After the wax is hardened, the coral skeleton is leached away using hydrochloric acid leaving a wax negative of the original coral template.

The wax negative is back-filled with PZT slurry and dried. The wax is subsequently burned off at a moderate temperature, leaving a coral-type structure of PZT. The structure is then sintered and back-filled with a desired polymer, usually a non-polarizable one, to make the final structure. The structure is then poled using conventional poling or corona discharge technique. The replamine process is described in Flexible Composite Transducers, D. P. Skinner et al.; Materials Research Bulletin, Vol. 13, 1978, pages 599–607 and is herein incorporated by reference.

In the case of the BURPS process, plastic spheres and PZT powders are mixed in an organic binder. After binder burn-out and sintering, a porous PZT skeleton is formed and later back-filled with polymer to form a 3-3 composite. The BURPS process is described in Simplified Fabrication of PZT/Polymer Composites, T. R. Shrout et al.; Materials Research Bulletin, Vol. 14, 1979, pages 1553–1559 which is also incorporated herein by reference.

It is well recognized in the art that the replamine and BURPS methods of forming composites are incapable of allowing for the production of 3-3 composites with ordered and controlled phase structures. For example, in the case of replamine process, the design, volume fraction and the scale of the structure depends on the starting coral template and can not be altered. The BURPS process too, lacks the flexibility of the design and fabrication of a fine scale 3-3 PZT composite structure with a controlled volume fraction.

A relatively new processing method, such as ceramic injection molding, has been developed for making fine scale 1-3 composites. The production of preforms with 2-2 composites as fine as 25-µm and PZT rods as fine as 30–40-µm in diameter has been reported by injection molding[ref]. This process can also be used to make composites with a variety of rod sizes, shapes and spacing. Advantages of injection molding include rapid throughput, low material waste, flexibility with respect to the transducer design and a low cost per part. A major disadvantage is, however, the high initial tooling costs.

B. Solid Freeform Techniques

Recently, solid freeform fabrication techniques have been developed for producing three-dimensional polymer articles without the need for molds, dies, or other tooling. One such technique, commercialized by Stratysys™, Inc. of Eden Prarie, Minn., builds solid objects layer by layer from polymer/wax compositions by using computer-aided design (CAD) software programs and is described in U.S. Pat. No. 5,121,329 and is incorporated herein by reference.

In general, the making of a ceramic/polymer composite using solid freeform technology includes the steps of (1) preparing a solid particle/binder feedstock composition; (2) forming a three-dimensional object from the feedstock composition by a fused deposition freeform fabrication process; (3) removing at least a portion of the binder from the formed object; and, optionally, (4) partially to fully densifying the object by heat treatment or otherwise. Each of these steps will be discussed in more detail below.

The feedstock compositions are generally prepared by mixing one or more solid particulate materials with a binder system consisting of one or more organic materials to form a mixture. As used herein, the term "particulate materials" refers to powders, platelets, granules, whiskers, and discontinuous and continuous fibers. The amount of solid particles in the mixture will depend, at least in part, on the bulk density of the article being produced. In that regard, for certain low density applications, the solid particles desirably constitute at least about 10 volume percent of the mixture. For forming higher density articles including articles that are fully dense, the solid particles desirably constitute at least about 40 volume percent, and more desirably, at least about 50 volume percent of the mixture.

The solid particles preferably are selected from the group comprising ceramic materials, elemental metals, metal alloys, steels and combinations of the foregoing. Ceramic materials may include, for example, oxides, carbides, borides, nitrides and the like, as well as combinations thereof; elemental metals may include, for example, silver, gold, platinum, nickel, aluminum, copper, gold, lead, magnesium, manganese, titanium, iron and combinations of these metals; and metal alloys may include, for example, alloys and combinations of alloys of the foregoing elemental metals. It is also contemplated that the solid particles may consist of or include an organic material component having a melting point which is higher than the melting points of the binder system components such that the particles will remain in solid form during the formulation of the feedstock composition and during the fused deposition forming process. These organic material particles may be used alone or in combination with solid particles of one or more of ceramic materials, elemental metals and metal alloys.

The physical properties of the particulate materials employed in the feedstock compositions largely will be dictated by the particular material being used and the properties sought in the article being produced. In this regard, techniques conventional in the ceramic and metallurgical industries may be utilized to prepare and characterize the particulate materials to be used in the process. Selection of an appropriate particle size distribution is particularly important so that the desired level of solids (low or high) can be loaded into the binder system while maintaining the flowability of the feedstock composition in the fluid state. Also, the size of the largest particles in the distribution should be substantially smaller than the diameter of the dispensing nozzle outlet so as to avoid any bridging effects. A maximum particle size of not more than one-fourth of the nozzle outlet diameter is preferred. There is no minimum particle size, the invention contemplating the use of nanoscale powders alone or in combination with particles in a larger particle size range.

Desirably, the particulate materials are mixed with a dispersing agent which modifies the cohesive forces between the particles and the components of the binder system, thereby enhancing the dispersion of the particles within the binder system and improving the flow of the feedstock composition during molding. Dispersing agents may be selected from the group consisting of dispersants, surfactants, coupling agents specific to the material being dispersed and combinations thereof. Dispersing agents typically are derived from fatty acids, fatty glycerol esters, fatty bisamides, and fatty esters not based upon glycerin, and the selection of a particular dispersing agent therefore will depend upon the particulate material and binder system components in the composition. Preferred dispersing agents for use with the preferred binder system described below may be selected from the group consisting of oleyl alcohol (9-octadecen-1-ol), 3-aminopropyltriethoxysilane, and KRTTS (Titanium IV 2-propanolato tris (isooctadecanoato-o)).

Preferably, between about 0.3 volume percent and about 19 volume percent of the dispersing agent (based upon the volume of the particulate materials), and more preferably between about 3 volume percent and about 12 volume percent of the dispersing agent, is added to the particulate material so as to produce an approximate surface coverage on the particles of one monolayer. Prior to its addition to the particulate material, the dispersing agent may be dissolved in an appropriate solvent. The dissolved dispersing agent may be intimately combined with the particles using conventional mixing techniques, such as ball milling, following which the solvent is removed from the mixture. After removal of the solvent, the particles may be screened in a conventional fashion to yield a free flowing particulate composition. The dispersing agent may, of course, be added directly to the mixture of the particulate materials and the binder system components during the mixing step.

The binder system preferably includes one or more organic components combined together to form a mixture which is either thermoplastic, thermosetting, water soluble, or organic solvent soluble, thermoplastic binder systems being particularly preferred. The formulation of the binder system will be influenced by many factors. Included among these factors are that the binder system exhibit good flow properties during the fused deposition forming process; be stable under the mixing and forming conditions; be compatible with the other components of the mixture; impart adequate strength in solid form; leave minimal residue following the binder removal step; impart sufficient flexibility to the feedstock composition so that it can be formed into filaments and spooled and unspooled without breakage, yet have enough stiffness and compressive strength to push the mixture out from the dispensing head during the fused deposition forming process as described further below; and have a low cost and long shelf life.

Although other binder systems and, in particular, other thermoplastic binder systems may be used, one series of preferred thermoplastic binder systems which exhibit the rheological and mechanical properties required for the fused deposition of solid particulate materials consists of several components, including a polymer which acts as the backbone of the system to hold the particles together and provide the mixture with a certain strength and stiffness, a wax which acts to lower the overall viscosity of the binder system, an elastomer which increases the flexibility and toughness of the system, and a tackifier which enhances bonding between the successive layers during the fused deposition forming process. Preferred polymers have a relatively low glass transition temperature and a relatively low melting point. Such polymers may be selected from the group consisting of polyvinyl alcohol, polyethylene, polyvinyl acetate, poly (vinyl ethers), poly (vinyl esters), vinyl ester copolymer, ethylene-vinyl acetate copolymer and combinations thereof as examples. Desirably, the polymer is present in the binder system in amounts of between about 5 volume percent and about 50 volume percent based upon the total volume of the binder system. Preferred waxes may be selected from the group consisting of paraffin waxes, microcrystalline waxes, synthetic hydrocarbon waxes, bees wax, oxidized polyethylene waxes and combinations of the foregoing. The binder system preferably includes between about 5 volume percent and about 50 volume percent of the wax component. Preferred elastomers may be selected from the group consisting of polychloroprene, styrene-butadiene copolymer, natural rubber, neoprene, polyisoprene, polybutadiene and combinations thereof. The elastomer desirably comprises between about 20 volume percent and about 70 volume percent of the binder system. Preferred tackifiers may be selected from the group consisting of terpene and polyterpene resins, terpene phenolic resins, aliphatic petroleum hydrocarbon resins, rosins, rosin derivatives, such as the ethylene glycol ester of rosin acids, and combinations thereof. Desirably, the tackifier is present in the binder system in amounts of between about 5 volume percent and about 50 volume percent. A particularly preferred binder system includes about 18.75 volume percent of a polymer, about 20.25 volume percent of a wax, about 28.0 volume percent of an elastomer, and about 33.0 volume percent of a tackifier.

In addition to the foregoing components, the binder system may include a plasticizer for increasing its overall flexibility. Selection of an appropriate plasticizer will depend upon several factors, including its compatibility with the particulate material and binder components in the mixture, its effectiveness in increasing the flexibility of the mixture in the solidified state, and its effect on the binder removal step. Preferred plasticizers may be selected from the group consisting of dibutyl phthalate, dihexyl phthalate, triphenyl phosphate, (dipropylene glycol) butyl ether, diethyleneglycolmonoricinoleate and combinations of the foregoing, dibutyl phthalate being particularly preferred. Desirably, the plasticizer is added in amounts of between about 1 volume percent and about 20 volume percent based on the total volume of the binder system.

Once the solid particulate materials and binder system components have been selected, these materials are mixed together to form a mixture. The importance of the mixing step cannot be underestimated, since deficiencies in the quality of the mixture most often cannot be corrected by subsequent processing adjustments. For example, the failure to deagglomerate and evenly distribute the particulate materials within the binder system may result in nonuniform shrinkage and the introduction of strength-limiting flaws in the article being produced. Preferably, the particulate materials and the binder system components in the molten or fluid state are mixed together using high shear mixing techniques to form a substantially homogeneous mixture having the desired loading of the particulate materials in the binder system, although mixtures which are less homogeneous or nonhomogeneous are also contemplated.

The mixture may be molded into rods or other blanks for use in the fused deposition forming step, or may be used directly in the fused deposition forming step without prior solidification. Alternatively, the mixture may be solidified and granulated, and used in the fused deposition forming step in the granulated form. Additionally, the granulated feedstock composition may be sieved to divide out particles in a preselected particle size range, and then processed through conventional apparatus, such as a capillary rheometer, piston extruder, single or twin screw extruder or the like, to form continuous flexible filaments having a diameter of between about 0.010 inches and about 0.50 inches. It is important to the fused deposition process that the diameter of the filaments be uniform along their length, with diameter variations of ±0.001 inches or less being particularly preferred. Desirably, these filaments may be wound in continuous lengths on a spool for use as the feedstock in the fused deposition forming process. Filaments should have sufficient flexibility that they may be wound in a smooth curve on a spool without breaking, and sufficient compressive strength that they do not buckle or otherwise overtly deform by compressive forces as they are fed into the dispensing head during the fused deposition forming process.

A fused deposition forming process which may be used in the forming step of the present invention is that described in detail in U.S. Pat. No. 5,121,329. According to the process, a flexible filament is fed from a supply spool into and through the dispensing head of a fused deposition apparatus. The dispensing head is positioned in close proximity to a build platform on which the article is to be built. The dispensing head and build platform are supported in a conventional manner for movement relative to one another along the "X", "Y" and "Z" axes as shown. Thus, the dispensing head may be mounted in a known fashion for movement in a plane defined by the X and Y axes, with the build platform supported for separate movement toward and away from the dispensing head along the Z axis. Alternatively, the build platform may be supported for movement in the plane defined by the X and Y axes, with the dispensing head mounted for separate movement along the Z axis toward and away from build platform. It will be appreciated that movement in the X-Y plane need not be limited to movement in orthogonal directions, but may include movement in radial, tangential, arcuate and other directions in the X-Y plane. The separate movement of the dispensing head and build platform in the X, Y and Z directions may be effected by any of the mechanical drive systems well known in the art. These drive systems preferably are driven by high resolution reversible stepper motors, although other types of drive motors may be used, including linear motors, servomotors, synchronous motors, D.C. motors and fluid motors.

The drive systems preferably are controlled by drive signals generated from a computer running a commercially available CAD program. Utilizing such program, the design of a three-dimensional article may be inputted to the computer. The article design then may be sectioned into multiple layers by a commercially available software program to provide data corresponding to the particular shape of each individual layer. Such software programs are in commercial use for computer-aided machining (CAM) purposes and include NC Polaris, Smartcam and Mastercam. The layering data signals may be directed to a machine controller (not shown) which selectively actuates the motors for driving the dispensing head and build platform in the X, Y and Z directions, respectively, depending upon the layering data signals received.

The dispensing head has a supply chamber with an inlet aperture at its upper end and a lower guide aperture through which the flexible filament is fed towards the discharge nozzle. The discharge nozzle includes a central material supply and a flow passage in flow communication at its lower end with a dispensing outlet having an orifice of predetermined size to assist in providing a metered supply of the feedstock material in a fluid state.

An electric resistance heater in the form of a sleeve or another suitable heater may be positioned around the discharge nozzle. A heater, under the control of a suitable temperature controller, heats the portion of flexible filament within passage of nozzle to a predetermined temperature only very slightly above its melting point so that the feedstock material will solidify very rapidly upon cooling after discharge onto build platform. It will be appreciated that the solid particulate materials in filament do not melt at the melting point. Thus, as used herein, the term "melting point" of the filament refers to the temperature at which the binder system components in the filament are substantially melted so as to place the overall composition of the filament in a fluid state in which it flows outwardly from the dispensing outlet onto the surface of the build platform. Of course, the dispensing head need not include a heater where the filament incorporates a thermosetting, water soluble, or organic solvent soluble binder system.

The flexible filament may be fed into and through the dispensing head by a plurality of the drive rollers connected to one another by a suitable belt or chain drive and driven simultaneously by a motor, such as a stepper motor, and a drive belt or chain. A plurality of idler rollers spaced opposite to drive rollers may cooperate therewith to grip flexible filament therebetween and to advance it through dispensing head towards the dispensing outlet of nozzle. By selective control of the drive motor, the rate of advance of the flexible filament, and thus the volumetric dispensing rate of the fluid feedstock onto the build platform, can be very closely controlled.

The size of the dispensing outlet may be varied depending upon the particular application, as by using interchangeable nozzles having different orifice sizes, or interchangeable orifice inserts in the tip of nozzle. Also, a variable size orifice of the type employed in cameras for varying the aperture could be utilized. The volumetric rate at which the material is dispensed from the dispensing head onto build platform 16 thus will be determined by a combination of the preselected orifice size of the dispensing outlet, as well as by controlling the rate of advance of the flexible filament through controlled rotation of the drive rollers.

As the filament is heated in the dispensing head to a fluid state, the solid particle filled fluid material is metered at a controlled flow rate onto the receiving surface of the build platform. The receiving surface preferably includes a substrate on which the article is actually built, which substrate minimizes localized shrinkage in the foundation layer of the article and permits the formed article to be released from the build platform without damage. One preferred substrate material is a relatively fine, wire mesh sandpaper such as Norton No. 47650-4. Forming the wire mesh from an electrically conductive material, such as copper wire, permits a low voltage current to be applied to heat the substrate slightly to facilitate the separation of the article therefrom. Alternatively, the substrate could be made from a water soluble wax which could be dissolved and easily separated from the article without damage; from a low density foam which easily can be cut or dissolved away from the article, such as a foam available from Stratasys, Inc. under the name Foundation Foam; or from other such substances.

The drive signals generated from the computer selectively move the dispensing head and build platform with respect to one another in a predetermined pattern as the feedstock material is being dispensed so as to build up multiple layers of the material and form an article of desired shape. Multiple passes of the dispensing head are made, with each pass taking place in a controlled pattern dictated by the layering software. The computer and related software programs determine the on and off conditions of the various motors controlling the movement of the dispensing head in the X-Y plane, the movement of the build platform in the Z direction, and the rotation of the driver rollers for advancing filament. Each of these motors may be operated separately, or one or more of them may be operated simultaneously depending on the shape of the article to be formed. The dispensing head is initially positioned at a predetermined height above the build platform or substrate to form the first layer. The height of each subsequent layer is then closely controlled in order to dispense and form very thin layers. The thinner the layers, the smoother the resulting surface of the formed article. Layers as thin as 0.001 inches may be formed. The layers can be formed in a horizontal plane, a vertical plane, or in a plane oriented at any angle with respect to the horizontal plane. Normally, the dispensing head will be mounted along the Z axis generally perpendicular to the receiving surface of the build platform which extends in the X-Y plane. Deposition of the material may take place along any of the three axes.

When forming and building up multiple layers, the initial relative movement of the build platform and dispensing head preferably will be in a horizontal plane defined by the X and Y axes. In a typical scenario, feedstock material may be dispensed to form a closed loop defining the outer perimeter of each layer as the dispensing head and build platform are moved relative to one another. The area within the closed loop then may be filled by moving the dispensing head back and forth relative to the build platform in a predetermined pattern consisting of one or more continuous raster segments. The first layer, which may take any shape dictated by the computer program, solidifies as it cools below the melting points of the binder components and adheres to the substrate. Upon completion of the raster fill in a layer, the dispensing head may move away from the layer by a predetermined layer thickness and the process may be repeated, the perimeter of the next layer being deposited first and then the area within the perimeter being filled by one or more continuous raster segments. Preferably, no material is dispensed onto a previously formed layer until that portion of the layer under the dispensing head has solidified. The second and each subsequent layer may take slightly different shapes as dictated by the particular cross-section for each layer from the computer program and layering software. Layer by layer are built up in this way until the entire three-dimensional article has been formed.

It will be appreciated that where the feedstock material incorporates a thermosetting, water soluble, or organic solvent soluble binder system, the solidification of the feedstock material from the fluid state may not involve a cooling step. Rather, solidification may occur through other mechanisms, including gellation, evaporation, curing, heating and chemical reaction.

In some instances, the dispensing head may move along the Z axis away from the build platform as a layer is being formed, such as when forming a spiral pattern. In such event, the software program will control the location of the dispensing head at the end of each layer. Thus, when at the start position for the next layer, the dispensing head may have already been raised a distance along the Z axis above the corresponding point on the previously formed layer. In such circumstance, dispensing head 14 may not have to be raised at all for deposition of the next layer, or it may have to be raised only an incremental portion of the predetermined layer thickness.

Each layer of material is dispensed in a fluid state, solidifies and adheres to the previous layer. This forms a strong bond between layers. When utilizing a dispensing head with a discharge nozzle having a flat bottom surface, the flat bottom surface of the nozzle produces a "doctor blade" effect as the dispensing head and build platform are moved relative to one another in the horizontal X-Y plane. By surface contact with the layer of material as it is being dispensed, the tip of the dispensing nozzle defines the top of each layer, and thus assists in maintaining each layer at the predetermined layer thickness. Alternatively, a separate squeegee, roller or doctor blade can be used to define the top of each layer, and thus the layer thickness. The multiple layers may be of uniform thickness or may vary in thickness as necessary and appropriate for forming a particular article. Also, the layers may each vary in thickness across the height of each layer.

Preferably, the melting point of the feedstock material is such that the deposited layer will solidify rapidly at the build environment temperature at the thicknesses in which it is dispensed. Where the feedstock material does not solidify rapidly upon being dispensed because of the relatively low melting temperature of the feedstock material or because of the relative thickness of the dispensed layer, then the dispensed layer may be cooled by conventional techniques either directly or through the build platform. Regardless of the technique used, any cooling operation must be carefully controlled to prevent defects such as shrinkage distortion, poor layer-to-layer bonding, cracking, etc.

Particular care must be exercised in depositing the layers so as to eliminate internal defects in the formed article. Internal defects such as voids, cracking and delaminations may arise from several different sources. Subperimeter voids typically are caused by the incomplete filling of the area inside the perimeter of the layers. As noted, each layer is built by laying down a predetermined width of road defining the outer boundary of each layer and then filling up the internal portion of the defined boundaries by raster scan. At the point where the path of the dispensing head approaches the perimeter of the layer during raster fill, the travel direction of the dispensing head changes to a path that is tangent to the perimeter. This technique may lead to the formation of a void as insufficient material flows to fill the volume at these intersections.

One way of overcoming this problem is to increase the dispensing rate at these points of intersection, either by increasing the feed rate of the filament to the dispensing head or by slowing down the movement of the dispensing head relative to the build platform. Another method of overcoming this problem is to alter the layering data signals so as to include a negative offset in the perimeter information. That is, the layering data signals may be altered to fill a larger area than actually exists within the perimeter of the layer. Thus, for example, assuming a layer is to be formed in the shape of a circle having an outer diameter of 2.0 inches, and the perimeter of the layer is deposited in a road width of 0.01 inches, then the area to be filled by raster scan across the diameter of the layer will be 1.98 inches (2.0–0.02). To assure complete filling at the intersection of the perimeter of the layer with the raster scan across the diameter of the layer, the layering data signals across the diameter may be altered to deposit a road which is 1.99 inches in length, thus producing a 0.005 inch overlap at each of the two points of intersection.

Still another way of overcoming the formation of subperimeter voids is to insert additional layering data signals at each point where a raster scan intersects with the perimeter road of a layer. In accordance with this technique, these additional data signals cause the dispensing head to jog in back and forth directions substantially parallel to the direction of the perimeter road so as to create "dog ears" in the deposited road at these points of intersection.

Internal voids may also result from the use of an incorrect road width for filling the internal area of each layer such that an unfilled region narrower than the road width remains after the raster scans for the layer have been completed. These defects can be eliminated by carefully determining the precise road width needed to fill each layer completely.

Still other voids may result from variations in the road width and thickness. That is, where there is a localized decrease or increase in the width or thickness of a road, two adjacent roads may not contact one another along their entire lengths, leaving a void space between them. Variations in the road width or thickness may be caused by inconsistent material flow which, in turn, may be due to slippage in the filament feed mechanism or to variations in the cross-sectional dimensions of the filament. Voids resulting from variations in the road width or thickness therefore may be minimized or eliminated by careful control of the cross-sectional dimensions of the filament and the feeding mechanism. In addition, these voids may be minimized by localized heating or cooling of the substrate to control shrinkage, the formation of localized sinks, and other defects which may arise as the feedstock material solidifies. These defects can also be addressed by altering the layering data signals to include a negative gap in the position of the road being deposited so that the roads move closer together in partially overlapping relationship.

Internal delaminations may arise when adjacent roads do not bond to one another. This is particularly problematic when depositing roads along long vector lengths, wherein the time delay between the deposition of two adjacent roads is high. This time delay results in a large temperature decay in the previously deposited road, such that there is poor adhesion between the adjacent roads. This poor adhesion in the "green" or undensified article may lead to delaminations during the binder removal and/or densification steps. The occurrence of this defect may be reduced by improving inter-road adhesion through the optimization of the tackifier component in the binder system, through localized substrate heating to retard the temperature decay in the deposited road, or through a redefined raster scan pattern.

Still other defects may occur when the contour of the layer to be filled does not permit a continuous fill pattern to be used. As a result of segmenting the fill pattern, an error may be caused along the "knit" or joining line between one segment and another. These knit lines frequently lead to cracking problems during binder removal and densification. This problem can be minimized by carefully designing the fill pattern to eliminate the need for multiple fill segments in a single layer. The problem may also be reduced by locally heating the substrate or increasing the fill rate so as to ensure good adhesion between the segments at the knit line.

It will be appreciated that innumerable modifications may be made to the fused deposition forming process. For example, as noted above, rather than in the form of a continuous filament, the feedstock material may be supplied to the dispensing head of the fused deposition apparatus in a fluid state, such as where a feedstock composition incorporating a thermoplastic binder system is supplied to the dispensing head at a temperature above its melting temperature; in the form of a granulated solid; or in the form of a solid rod, bar of filament of finite length. Regardless of the form in which the feedstock material is supplied to the dispensing head, the supply mechanism must be capable of careful control so that the volumetric dispensing rate of the feedstock material can be controlled accurately.

In addition to the dispensing head, the fused deposition process can be carried out using other types of apparatus known in the art, provided that dispensing through that apparatus can be controlled accurately. Such apparatus may include, for example, conventional piston or plunger types of dispensing mechanisms, or highly controllable screw-type feeders such as that disclosed in U.S. Pat. No. 5,312,224.

Also, the fused deposition process may be arranged so that multiple and different feedstock materials can be dispensed either alternately through a single dispensing nozzle, or alternately or simultaneously through multiple dispensing nozzles. Methods for dispensing multiple and different feedstock compositions are disclosed in U.S. Pat. No. 5,121,329 referred to and incorporated by reference hereinabove. These methods may be designed, for example, to dispense a composition including a metal from one nozzle to form the outer surface of the article and a composition including a ceramic from another nozzle to fill the inner portion of the article (or vice versa); to dispense a material (metal, ceramic, polymer or mixture thereof) from one nozzle and a different material (metal, ceramic, polymer or mixture thereof) from another nozzle in alternating layers to form a multiphase article; or to dispense two or more different materials (metal, ceramic, polymer or mixture thereof) in different or alternating regions within one or more single layers.

Following its formation by the fused deposition process, article 100 may be processed to improve its surface finish. Such processing may include machining of the surface by sanding, grinding, vibrating in an abrasive media, and other techniques known in the art. This machining step may take place while the article is in the "green" state prior to binder removal, with the article in the "bisque" state prior to densification, after densification, or at a combination of these stages. Also, a machining step may be performed on a layer by layer basis during the fused deposition forming process. Furthermore, article 100 optionally may be subjected to a post fabrication treatment such as cold isostatic pressing or warm isostatic pressing to facilitate the removal of any residual internal voids, delaminations or other defects.

Subsequent to any green machining operation, article 100 may be processed to remove at least a portion of the binders therefrom. Binder removal may be accomplished by various techniques, including solvent extraction, supercritical fluid processes, thermal processes and combinations thereof. One preferred binder removal technique is a thermal processing step in which the article is gradually heated according to a predetermined time-temperature schedule. The parameters of this thermal processing or "binder burnout" cycle will, of course, depend upon the particular formulation of the binder system. Other factors influencing the binder burnout cycle include the relative proportion of the binder in the article, the proportion of the binder to be removed, the cross-sectional size and shape of the article, and the physical and thermal properties of the solid particles therein. The development of appropriate burnout cycles are conventional, for example, to those skilled in the art of injection molding of ceramics or metals.

In a typical binder burnout cycle, the article is slowly heated to cause the components of the binder system having the lowest melting point to initially soften and flow out of the article through capillary action. This creates channels within the article which facilitate the removal of the binder from the interior of the article, as well as the removal of the binder components having higher melting points. The removal of the binder from the article through capillary liquid transport may be enhanced by completely or partially embedding the article in a setter filled with an inert, thermally stable setter powder such as alumina or carbon. After removal of the binder through capillary liquid transport has proceeded to a certain extent, the temperature may be gradually increased, whereupon the components of the binder may begin to thermally decompose and be removed from the article by diffusion and evaporation. The binder burnout cycle may be conducted in an inert atmosphere, in an oxidizing atmosphere or in a reducing atmosphere depending on the binders being removed, the amount being removed, the composition of the particulate materials in the article, etc.

Binder burnout may take place in a continuous cycle, or may include one or more cooling phases defining individual stages of the cycle. The development of the appropriate binder burnout cycle is critical since too rapid a rate of binder removal frequently results in the generation of defects within the article. Such defects include, for example, bloating, blistering, surface or internal cracking and delaminations.

Following the binder removal step, the article optionally may be subjected to a densification step. Densification may be accomplished in many ways, including thermal treatment, hot pressing, hot isostatic pressing, reaction bonding, directed metal oxidation, reaction infiltration, chemical vapor deposition and combinations thereof. In a preferred densification procedure, the article may be sintered according to a preselected time-temperature schedule to bond the particles therein together and to develop the final properties of the article. Again, the time-temperature profile of the sintering step will depend upon the compositions of the solid particles in the article and the properties desired to be obtained. Generally, more refractory or thermally stable particulate materials must be sintered at higher temperatures and/or for longer times to develop higher strength and density.

Rather than sintering to densify the article after the binder removal step, the article may be "bisque" fired to a relatively low temperature to bond the particles together sufficiently for the article to be handled without breaking. The bisque fired article may then be used as is, or may be further processed as desired, for example, by infiltrating its pores with a metal, polymer, glass, ceramic solution or the like.

Although the fused deposition technique is explained in detail above, other techniques, including, but not limited to, stereolithography, selective laser sintering, sanders prototype, and laminated object manufacturing can be used in this invention. In stereolithography, for example, as described in U.S. Pat. No. 4,929,402, which is herein incorporated by reference, an ultraviolet ray curable polymer is used as a feed material and a computer controlled and focused beam of ultra violet rays is used to fabricate three dimensional objects.

In selective laser sintering, which is described in U.S. Pat. No. 4,938,816 and which is hereby incorporated by reference, a laser curable polymer is used as a feed material and a computer controlled and focused laser beam is used to fabricate three dimensional objects. In Sanders™ Prototype technology, an ink jet printing process is used where a thermoplastic polymer is used instead of an ink. Three-dimensional objects are built by depositing layer upon layer of thermoplastic polymer on a computer controlled fixtureless platform.

In Laminated Object Manufacturing (LOM), sheets of paper, polymer, or ceramic materials are deposited on top of each previous layer and a computer controlled laser beam is used to cut the sheet of material to make the three dimensional object.

This invention takes advantage of the aforementioned solid freeform fabrication technology to allow for the efficient manufacture of angularly oriented piezoelectric ceramic composites having enhanced properties.

SUMMARY OF THE INVENTION

The object of this invention is the creation of novel electronic ceramic composite designs with varied angular orientation of the piezoelectric or active phase with respect to the poling axis.

Another object of this invention is to provide for piezoelectric ceramic and ceramic/polymer composites with enhanced electromechanical properties.

Yet another object of the invention is to more effectively utilize the $d_{33}$, $d_{31}$ and $d_{15}$ coefficients to get a $d_{33(effective)}$ coefficient which yields a piezoelectric composite with enhanced properties.

A novel feature of this invention is that the angular orientation of the piezoelectric ceramic phase is varied with respect to the poling axis thus giving the composites enhanced properties.

The novel composite designs disclosed herein allow one to acheive an effective $d_{33}$ on the face perpendicular to the Z direction. When a unit stress is applied to these novel piezoelectric composites in the Z direction, the polarization on the face perpendicular to it has contributions from the $d_{33}$, $d_{31}$ and $d_{15}$ components. There is a positive contribution from the $d_{33}$ coefficient (due to the presence of a component of stress in the Z direction), a positive contribution from the $d_{31}$ coefficient (due to the presence of component of the applied stress in the X and Y directions), and a positive $d_{15}$ contribution (due to shear acting on the piezoelectric elements of the composite). The effective polarization measured on the face perpendicular to the Z direction can be given as:

$$P3 = d_{33(effective)} \cdot \sigma_3 = (a.d_{33} + b.d_{31} + c.d_{15}) \cdot \sigma_3 \quad (5)$$

The total polarization observed would depend on the values of a, b, and c where they vary from (−1) to 1. The actual values of a, b and c would depend on the design of the composites i.e., the orientation of the elements to the Z axis, along which the stress is applied.

More specifically this invention is a piezoelectric composite comprising:

at least one piezoelectric phase and at least one non-piezoelectric phase wherein said piezoelectric phase is oriented at an angle with respect to the poling direction.

BRIEF DESCRIPTION OF THE DRAWINGS

Comprehension of the invention is facilitated by reading the following detailed description in conjunction with the annexed drawings, in which.

DETAILED DESCRIPTION OF THE INVENTION

As mentioned herein, the $d_{15}$ component in piezoelectric monoliths and ceramic/polymer composites has not been effectively utilized to engineer devices with increased piezoelectric properties. This, despite the fact that it has a much higher value and therefore much is to be gained, compared to the traditionally utilized $d_{33}$ coefficient.

Figure 1:
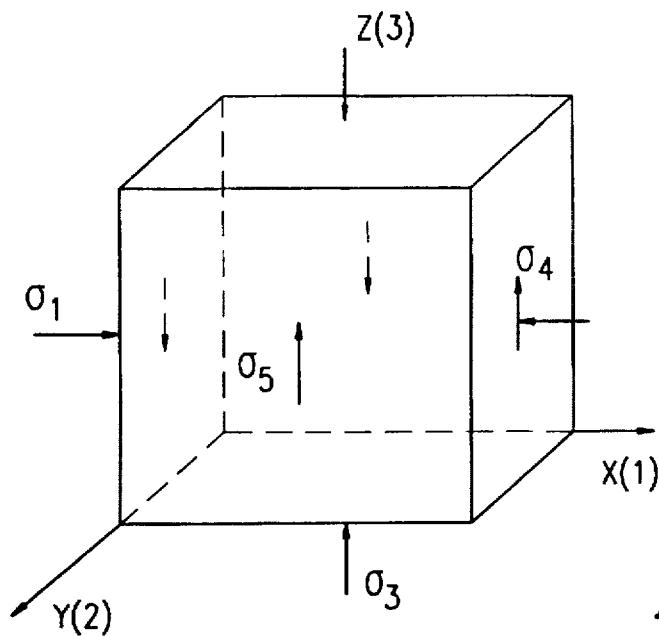
FIG. 1 is a schematic of a block of PZT ceramic poled along the z direction.

The $d_{15}$ component can be utilized only by applying a shear stress $\sigma_4$ or $\sigma_5$, as shown in FIG. 1, and collecting the charge on the face perpendicular to the X or Y direction. The main reason for not using this coefficient was the absence of a novel designs which could make it possible to collect the charge on the Z face on which the stress is traditionally applied. However, such novel designs can now be made using the aforementioned solid freeform fabrication (SFF) techniques.

Figure 2A:
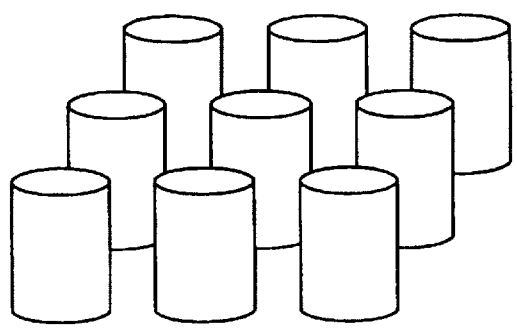
FIGS. 2(a,b) are schematics of a 1-3 and a 3-3 composite.
Figure 2B:
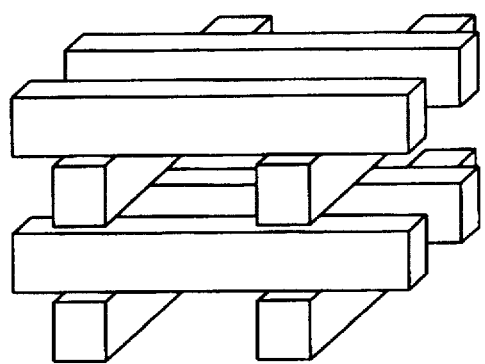

As opposed to the traditional 1-3 and 3-3 composite designs pictured in FIG. 2, the unique designs disclosed herein utilize both the high $d_{15}$ coefficient and also the $d_{31}$ coefficient to enhance the effective $d_{33}$ of piezoelectric ceramic/polymer composites. In accordance with the principles of this invention, instead of being aligned along the Z direction as is done in most traditional composites, the active or piezoelectric phase is oriented at an angle to the Z poling direction. All or just a portion of the active piezoelectric phase may be so oriented.

Figure 3A:
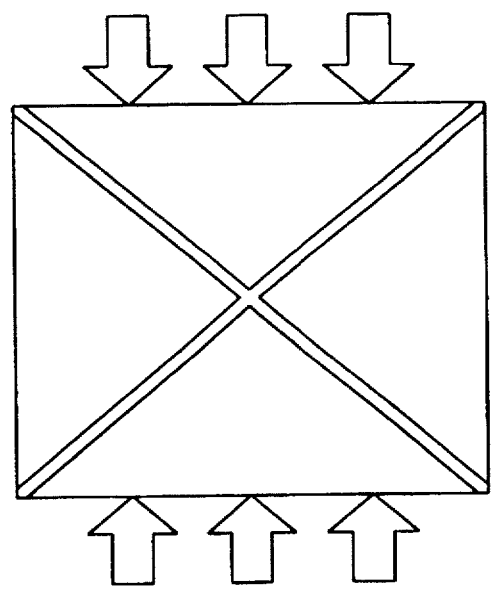
FIG. 3(a) is a schematic of the stress applied in the z direction for an oriented composite poled along the same direction.

FIG. 3(a) shows the active phase of a composite consisting of two piezoelectric elements oriented at an angle to the vertical. The piezoelectric elements may be any shape (i.e. rods, bars, tubes, fibers, etc.) desired provided they are angled to the axis along which the stress is applied. Some of these structures can not been made using injection molding techniques.

Figure 3B:
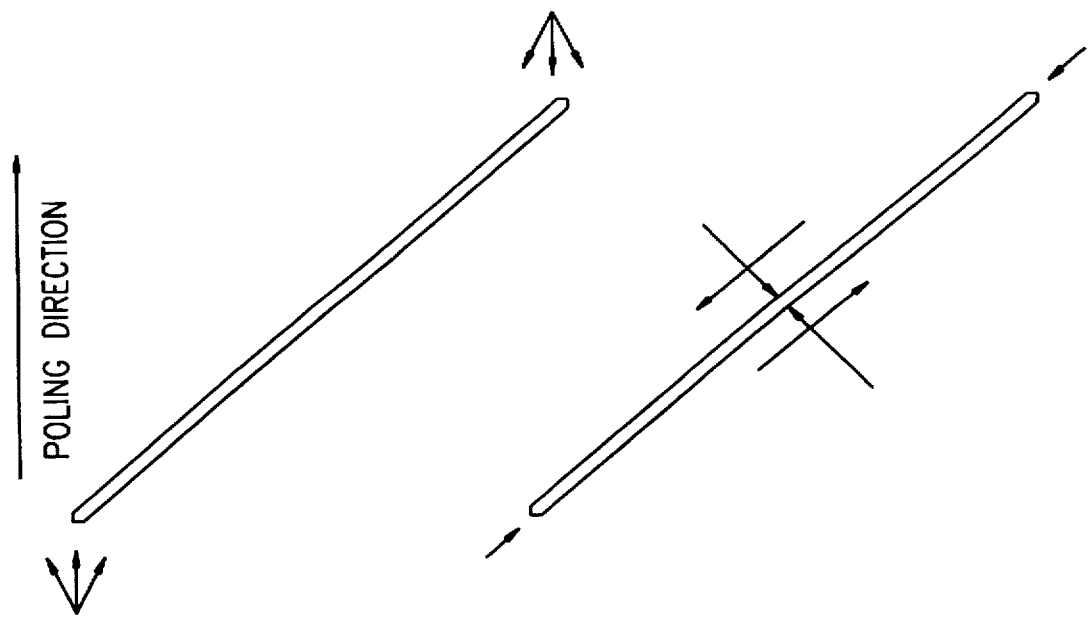
FIG. 3(b) is a schematic of the stress distribution along a single rod in an oriented composite.

As shown in FIG. 3(b), a stress applied along the Z direction can be split up into two components: parallel to the rod; and perpendicular to the rod. Accordingly, there is a stress distribution on each rod which includes a shear stress as well as the other normal stresses. These stress components lead the $d_{33}$ (due to the stress compressing the rod in the length direction), the $d_{31}$ (due to the stress tensioning the rod along the diameter, which effectively leads to a compression along the length direction), and the $d_{15}$ (due to the shear on the rods along the faces) coefficients to play a role in determining the final polarization that is observed on the faces perpendicular to the Z direction.

The piezoelectric element orientation to the poling axis also plays an important role in determining the final properties. As already defined in equation (5) the effective $d_{33}$ is given by, $$d_{33(effective)} = (a.d_{33} + b.d_{31} + c.d_{15})$$

The change in the orientation of the rods from the vertically applied stress direction, leads to a change in the values of the coefficients a, b, and c. The orientation angle can be varied from 0°–90° to get the optimum orientation and properties of the final composite.

Therefore, any piezoelectric composite where the rods are oriented at an angle to the applied stress direction will give rise to this phenomena. Also, there is an optimum orientation of the rods where the effective $d_{33}$ will have the highest value. At this angle, the total contributions from the $d_{33}$, $d_{31}$ and $d_{15}$ coefficients will be at a maximum.

It is well known that the connectivity of the composites also plays a significant role in determining the use and final electromechanical properties. As mentioned above, the connectivity of the composite is written as A-B. Here A is the number of orthogonal directions in which the ceramic phase is self connected, while B indicates the continuity of the non-piezoelectric phase in the X, Y and Z directions.

Figure 4A:
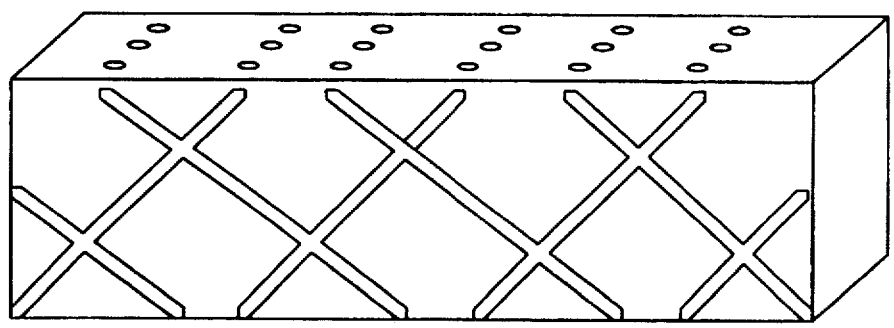
FIGS. 4(a,b,c) are schematics of various 1-3, 2-3, and 3-3 angularly oriented composite structures.

A variety of composites with different connectivities can be made where the piezoelectric PZT ceramic elements are oriented at an angle to the poling axis. FIG. 4 shows three schematics of such composites. FIG. 4(a) shows an oriented 3-3 composite where the piezoelectric rods are oriented at ±45° to the vertical (Z-axis) This structure is characterized by the intersection of the fibers at many points within the specimen to form joint which makes the ceramic continuous in the Y direction. Apart from continuity in the Z direction, the ceramic is also continuous along the X direction as the end to end distance can be traversed by following a zig-zag route on the ceramic. Thus, for this 3-3 composite, both the rod orientation and the number of joints in the structure will dictate the properties.

Figure 4B:
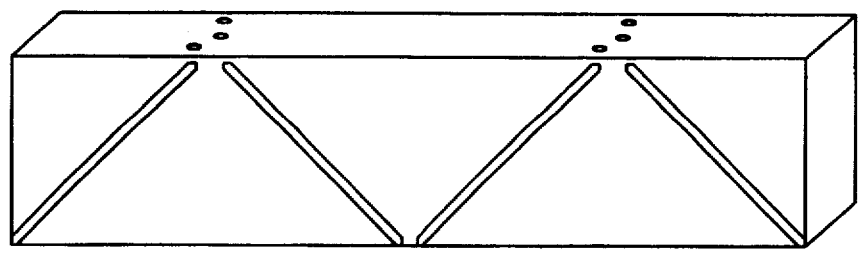
Figure 4C:
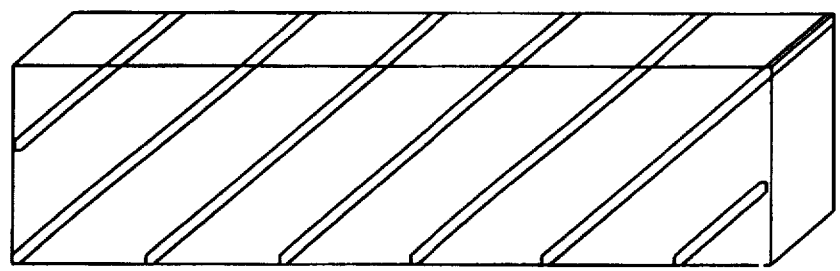

FIG. 4(b) shows a 1-3 connectivity composite where the rod angles are at ±45°. Here, the rods are free to vibrate as there are no interconnecting joints. A 2-2 composite structure that can also be formed by using sheets of ceramic instead of rods oriented to the vertical poling axis is shown in FIG. 4(c).

The properties of the above structures can be further modified by changing the angle of orientation of the piezoelectric ceramic elements from ±0° through ±90°, and varying the dimension and spacing (and hence the volume fraction) of the elements. The elements could also be aligned in one single direction or oriented in different directions in the same structure. Moreover, these structures are not limited to the above shapes.

These novel structures can be manufactured by a variety of methods including but not limited to: align and fill, dicing, modified lost mold method and Fused Deposition of Ceramics (FDC). For example, the 1-3 structures in FIGS. 4(b) can be made by align and fill technique.

Moreover, the piezoelectric ceramic components, comprising rods, bars, fibers or sheets, could be made from any process including extrusion and tape casting. These active phase constituents can thereafter be laid on top of each other at different orientations to the vertical in case of the fibers. In such cases, special care has to be taken to confirm the connectivity of the fibers in the Y direction. A preferred method of making a 3-3 structure are the SFF methods described above.

The 2-2 structure in FIG. 4(c) can be made using tape casting and the lost mold method, among others. The lost mold method involves the design of a sacrificial polymer mold with a negative of the above structure that can be infiltrated with slurry or gel. Solid freeform fabrication techniques like FDC can be used to easily manufacture all the above parts. The sintered structures can then be embedded into an epoxy or polymer to form a ceramic/polymer composite.

After polishing and electroding the sides perpendicular to the Z-direction, these composites are ready to be poled. The electromechanical properties of the composite can then be determined. Instead of embedding the ceramic in polymer, the sintered ceramic structures can also be poled directly to form a ceramic/air composite. The polarization's and displacements that are obtained for piezoelectric materials on the application of a respective stress or voltage, are shown in the following equations:

$$P_i = d_{ij} \sigma_j$$

$$P_3 = d_{33} \sigma_3$$

$$S_i = d_{il} E_l$$

$$S_3 = d_{33} E_3$$

Here P is the polarization, σ is the stress applied, S is the strain generated and E is the electric field applied. For the oriented composites, the effective $d_{33}$ is higher so it will result in a higher polarization and displacement as seen on the face perpendicular to the Z direction. Hence these materials can be used to make both better sensors and higher displacement actuators.

Composites having the structure disclosed herein may have applicability, for example, in hydrophones. The following equations show the effectiveness of using these composites for such applications where a high figure of merit is desired:

$$\text{Figure of Merit} = d_h{}^* g_h \quad (7)$$

$$d_h = d_{33} + 2d_{31} \quad (8)$$

$$g_h = d_h / \epsilon_o K \quad (9)$$

Here K is the dielectric constant of the composite and $\epsilon_o$ is the permittivity of free space. In this equation the $d_{33}$ mentions here would be the effective $d_{33}$.

Earlier work has shown that 3-3 composites are well suited for hydrophones as they reduce the detrimental effect of the $d_{31}$ coefficient. Using an oriented 3-3 composite where the effective $d_{33}$ is high and the contribution of the $d_{31}$ coefficient is suppressed, it is possible to get a very high figure of merit.

EXAMPLE 1

Piezoelectric PZT-5H ceramic/polymer composites were fabricated via Fused Deposition of Ceramics (FDC) A surfactant (1 vol % oleyl alcohol) was added to the PZT-5H powder (Morgan Matroc Inc., Ohio) after burning out the binder present in the as received spray dried powder. This powder was then compounded with plasticizer and binder (48 Vol. % binder+plasticizer/52 Vol. % PZT-5H ceramic powder) in a Haake Rheocord System 40 (Passaic, N.J.) mixer. The binder system used was a Stratasys™ Inc. commercial ICW-04 (investment casting wax) thermoplastic binder. Dibutylpthalate was used as a plasticizer at 1 weight % of the binder.

After compounding the 52 vol. % ceramic loaded polymer at 75° C. for 1 hour, it was ground to a finer size (2–5 mm). These granules were then loaded into a capillary extruder with a 1750 μm die, attached to an Instron 4505. PZT ceramic loaded filaments were extruded at 65°–70° C., using a pressure in the range of 600–900N at a stroke rate of 1 mm/minute. These filaments formed the starting material for the Stratasys™ 3D-Modeler (Stratasys Inc., Eden Prairie, Minn.).

3-3 piezoelectric ceramic structures with fibers or rods oriented at ±15°, 30°, 45°, 60°, and 75° were made using a CAD program. A surface file (also called a .stl file) was created from the CAD file that the machine takes as the input. This file was then converted into cross sectional slices where each slice has its own build strategy achieved by varying the tool path. The ceramic loaded filaments were passed through a liquefier heated to 190° C. The liquefier extruded a road of material through a 400 μm nozzle diameter, depositing it on a foam substrate attached to a fixtureless platform capable of moving in the Z direction. The liquefier moves in the X-Y plane based on the shape of the part to be built. After depositing the first layer the fixtureless platform moves down the height of one layer, and the next layer is built on top of it. These steps are repeated until the whole structure is made. The final dimensions of the green ceramic part were about 25.4 mm×25.4 mm×10 mm. The part was removed from the foam substrate for processing by conventional methods.

After manufacture by FDC, the green ceramic structure was kept on a zirox (TAM Ceramics) powder bed inside an alumina crucible. The part was heated to 350° C. at 1° C./min and held for 1 hour to allow the low temperature organic components to evaporate. The temperature was then increased to 550° C. at 1° C./min and held for 4 hours to remove the binder. A third soak at 780° C. for 1 hour, with a heating rate of 3.5° C./min was necessary to provide enough bisque strength to the part for mechanical handlability. In order to reduce the lead loss which occurs at temperatures >900° C., the ceramic structure was sealed in the alumina crucible with excess lead titanate powder. The sealed samples were then heated at 3.5° C./min to 1285° C., and held at the temperature for 90 minutes to sinter the PZT ceramic. After sintering, the individual fibers had a diameter of ~225–275 μm and the spacing between parallel fibers was 200 μm.

The sintered samples were then embedded in a standard Spurr Epoxy (Ernest F. Fullam Inc., Latham, N.Y.) and cured in an oven at 70° C. for 12 hours. The sample was then cut to form specimens as shown in FIG. 1. The volume fraction of the PZT in the composite was found using the equation. Volume % Ceramic=(density$_{composite}$-density$_{polymer}$)/(density$_{ceramic}$-density$_{polymer}$).

The sides of the composite (Sides perpendicular to the Z-direction) were then electroded with an air dried silver paint (No 200, Demetron, Liepzeger, Germany) and the composite specimens were poled in a corona poling apparatus at 70° C. The electrical properties of the composite were measured after aging the specimens for at least 1 day. The capacitance (C) and the dielectric loss factor (tanδ) were measured, before and after poling, at 1 kHz using a RLC difibridge (Model 1689M, Gen. Rad. Inc., Boston, Mass.). The dielectric constant was calculated using the relation K=Cd/$\epsilon_o$A where d is the specimen thickness, A is the total electroded area and $\epsilon_o$ is the permittivity of free space (8.85×10$^{-12}$) Farads/meter).

The d coefficient of the composites was measured at 100 Hz using a piezo d$_{33}$ meter (Model CPDT-3300, Channel Products Inc., Cleveland, Ohio). The g$_{33}$ was calculated using the relation g$_{33}$=d$_{33}$/($\epsilon_r$K). The impedance plots of the composites vs. frequency were used to measure the series and parallel resonant frequencies.

| Rod Angle to the poling direction | V$_{PZT}$ (%) | K | tanδ | d$_{33}$ | k$_t$ (%) |
|---|---|---|---|---|---|
| Monolith PZT-5H | 100 | 2300 | | 550 | 52 |
| 3-3 Angular Composite (±15°) | 60 | 1560 | 2.5 | 350 | 62 |
| 3-3 Angular Composite (±30°) | 60 | 1580 | 2.25 | 510 | 59 |
| 3-3 Angular Composite (±45°) | 65 | 1350 | 2.75 | 390 | — |
| 3-3 Angular Composite (±60°) | 66 | 1200 | 2.10 | 225 | — |
| 3-3 Angular Composite (±75°) | 58 | 620 | 2.10 | 175 | — |

Units are as follows: V=%; d$_{33}$=picoColomb/Newton.

The invention described herein has been disclosed in terms of specific embodiments and applications. However, these details are not meant to be limiting and other embodiments, in light of this teaching, would be obvious to persons skilled in the art. Accordingly, it is to be understood that the drawings and descriptions are illustrative of the principles of the invention, and should not be construed to limit the scope thereof.

We claim:

1. A piezoelectric composite comprising:
at least one piezoelectric phase and at least one non-piezoelectric phase wherein said piezoelectric phase is oriented at an angle with respect to the poling direction and wherein at least one said piezoelectric phase is continuously self-connected in three directions.

2. The piezoelectric composite of claim 1 wherein the piezoelectric phase(s) is selected from the group consisting of Pb(Zr,Ti)O$_3$, BaTiO$_3$, PbZrO$_3$, PbTiO$_3$, PbNb$_2$O$_6$, (Pb, Ca)TiO$_3$, (Pb,Sm)TiO$_3$, Pb(NbO$_2$)$_2$/PbTiO$_3$, (1-x)Pb(Mg$_{1/3}$Nb$_{2/3}$)O$_3$-xPbTiO$_3$, (1-x-y)Pb(Zn$_{1/3}$Nb$_{2/3}$)O$_3$-xPbTiO$_3$-yBaTiO$_3$, and (1-x-y)Pb(Zn$_{1/3}$Nb$_{2/3}$)O$_3$-xBaTiO$_3$-yPbTiO$_3$, xPZN-(1-x)PMN, xPMN-(1-x)PZT, xPZN-(1-x)PZT.

3. The piezoelectric composite of claim 1 wherein the non-piezoelectic phase(s) is selected from the group consisting of epoxy, polymer, silicone rubber, polyvinylchloride, glass, air, metal, or ceramic.

4. A piezoelectric composite of claim 1 wherein at least one non-piezoelectric phase is continuously self-connected only in three dimensions.

5. The piezoelectric composite of claim 4 wherein the piezoelectric phase(s) is selected from the group consisting of Pb(Zr,Ti)O$_3$, BaTiO$_3$, PbZrO$_3$, PbTiO$_3$, PbNb$_2$O$_8$, (Pb, Ca)TiO$_3$, (Pb,Sm)TiO$_3$, Pb(NbO$_2$)$_2$/PbTiO$_3$, (1-x)Pb(Mg$_{1/3}$Nb$_{2/3}$)O$_3$-xPbTiO$_3$, (1-x-y)Pb(Zn$_{1/3}$Nb$_{2/3}$)O$_3$-xPbTiO$_3$-yBaTiO$_3$, and (1-x-y)Pb(Zn$_{1/3}$Nb$_{2/3}$)O$_3$-xBaTiO$_3$-yPbTiO$_3$, xPZN-(1-x)PMN, xPMN-(1-x)PZT, xPZN-(1-x)PZT.

6. The piezoelectric composite of claim 4 wherein the non-piezoelectric phase(s) is selected from the group consisting of epoxy, polymer, silicone rubber, polyvinylchloride, glass, air, metal, or ceramic.

7. A piezoelectric composite comprising: at least one piezoelectric phase and at least one non-piezoelectric phase wherein said piezoelectric phase is oriented at an angle with respect to the poling direction and wherein at least one non-piezoelectric phase is continuously self-connected in three dimensions.

8. The piezoelectric composite of claim 7 wherein the piezoelectric phase(s) is selected from the group consisting of Pb(Zr,Ti)O$_3$, BaTiO$_3$, PbZrO$_3$, PbTiO$_3$, PbNb$_2$O$_6$, (Pb, Ca)TiO$_3$, (Pb,Sm)TiO$_3$, Pb(NbO$_2$)$_2$/PbTiO$_3$, (1-x)Pb(Mg$_{1/3}$Nb$_{2/3}$)O$_3$-xPbTiO$_3$, (1-x-y)Pb(Zn$_{1/3}$Nb$_{2/3}$)O$_3$-xPbTiO$_3$-yBaTiO$_3$, and (1-x-y)Pb(Zn$_{1/3}$Nb$_{2/3}$)O$_3$-xBaTiO$_3$-yPbTiO$_3$, xPZN-(1-x)PMN, xPMN-(1-x)PZT, xPZN-(1-x)PZT.

9. The piezoelectric composite of claim 7 wherein the non-piezoelectric phase(s) is selected from the group consisting of epoxy, polymer, silicone rubber, polyvinylchloride, glass, air, metal, or ceramic.

10. A piezoelectric composite of claim 7 wherein at least one piezoelectric phase is continuously self-connected only in one dimension.

11. The piezoelectric composite of claim 10 wherein the piezoelectric phase(s) is selected from the group consisting of Pb(Zr,Ti)O$_3$, BaTiO$_3$, PbZrO$_3$, PbTiO$_3$, PbNb$_2$O$_6$, (Pb, Ca)TiO$_3$, (Pb,Sm)TiO$_3$, Pb(NbO$_2$)$_2$/PbTiO$_3$, (1-x)Pb(Mg$_{1/3}$Nb$_{2/3}$)O$_3$-xPbTiO$_3$, (1-x-y)Pb(Zn$_{1/3}$Nb$_{2/3}$)O$_3$-xPbTiO$_3$-yBaTiO$_3$, and (1-x-y)Pb(Zn$_{1/3}$Nb$_{2/3}$)O$_3$-xBaTiO$_3$-yPbTiO$_3$, xPZN-(1-x)PMN, xPMN-(1-x)PZT, xPZN-(1-x)PZT.

12. The piezoelectric composite of claim 10 wherein the non-plezoelectric phase(s) is selected from the group consisting of epoxy, polymer, silicone rubber, polyvinylchloride, glass, air, metal, or ceramic.

13. A piezoelectric composite comprising: at least one piezoelectric phase and at least one non-piezoelectric phase wherein said piezoelectric phase is oriented at an angle with respect to the poling direction and wherein at least one piezoelectric phase is continuously self-connected in two dimensions.

14. A piezoelectric composite of claim 13 wherein at least one non-piezoelectric phase is continuously self-connected only in two dimensions.

15. The piezoelectric composite of claim 14 wherein the piezoelectric phase(s) is selected from the group consisting of $Pb(Zr,Ti)O_3$, $BaTiO_3$, $PbZrO_3$, $PbTiO_3$, $PbNb_2O_6$, $(Pb,Ca)TiO_3$, $(Pb,Sm)TiO_3$, $Pb(NbO_2)_2/PbTiO_3$, $(1-x)Pb(Mg_{1/3}Nb_{2/3})O_3-xPbTiO_3$, $(1-x-y)Pb(Zn_{1/3}Nb_{2/3})O_3-xPbTiO_3-yBaTiO_3$, and $(1-x-y)Pb(Zn_{1/3}Nb_{2/3})O_3-xBaTiO_3-yPbTiO_3$, xPZN–(1–x)PMN, xPMN–(1–x)PZT, xPZN–(1–x)PZT.

16. The piezoelectric composite of claim 14 wherein the non-piezoelectric phase(s) is selected from the group consisting of epoxy, polymer, silicone rubber, polyvinylchloride, glass, air, metal, or ceramic.

17. The piezoelectric composite of claim 13 wherein the piezoelectric phase(s) is selected from the group consisting of $Pb(Zr,Ti)O_3$, $BaTiO_3$, $PbZrO_3$, $PbTiO_3$, $PbNb_2O_6$, $(Pb,Ca)TiO_3$, $(Pb,Sm)TiO_3$, $Pb(NbO_2)_2/PbTiO_3$, $(1-x)Pb(Mg_{1/3}Nb_{2/3})O_3-xPbTiO_3$, $(1-x-y)Pb(Zn_{1/3}Nb_{2/3})O_3-xPbTiO_3-yBaTiO_3$, and $(1-x-y)Pb(Zn_{1/3}Nb_{2/3})O_3-xBaTiO_3-yPbTiO_3$, xPZN–(1–x)PMN, xPMN–(1–x)PZT, xPZN–(1–x)PZT.

18. The piezoelectric composite of claim 13 wherein the non-piezoelectric phase(s) is selected from the group consisting of epoxy, polymer, silicone rubber, polyvinylchloride, glass, air, metal, or ceramic.

19. A piezoelectric composite comprising: at least one piezoelectric phase and at least one non-piezoelectric phase wherein said piezoelectric phase is oriented at an angle with respect to the poling direction and wherein at least one non-piezoelectric phase is continuously self-connected in two dimensions.

20. The piezoelectric composite of claim 19 wherein the piezoelectric phase(s) is selected from the group consisting of $Pb(Zr,Ti)O_3$, $BaTiO_3$, $PbZrO_3$, $PbTiO_3$, $PbNb_2O_8$, $(Pb,Ca)TiO_3$, $(Pb,Sm)TiO_3$, $Pb(NbO_2)_2/PbTiO_3$, $(1-x)Pb(Mg_{1/3}Nb_{2/3})O_3-xPbTiO_3$, $(1-x-y)Pb(Zn_{1/3}Nb_{2/3})O_3-xPbTiO_3-yBaTiO_3$, and $(1-x-y)Pb(Zn_{1/3}Nb_{2/3})O_3-xBaTiO_3-yPbTiO_3$, xPZN–(1–x)PMN, xPMN–(1–x)PZT, xPZN–(1–x)PZT.

21. The piezoelectric composite of claim 19 wherein the non-piezoelectric phase(s) is selected from the group consisting of epoxy, polymer, silicone rubber, polyvinylchloride, glass, air, metal, or ceramic.

* * * * *